US006795366B2

(12) United States Patent
Lee

(10) Patent No.: US 6,795,366 B2
(45) Date of Patent: Sep. 21, 2004

(54) INTERNAL VOLTAGE CONVERTER SCHEME FOR CONTROLLING THE POWER-UP SLOPE OF INTERNAL SUPPLY VOLTAGE

(75) Inventor: June Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/272,404

(22) Filed: Oct. 15, 2002

(65) Prior Publication Data

US 2004/0071036 A1 Apr. 15, 2004

(51) Int. Cl.[7] .................................................. G11C 7/00
(52) U.S. Cl. .................. 365/226; 365/229; 365/189.09
(58) Field of Search ................................ 365/226, 229, 365/189.09, 185.19, 185.23, 185.24; 327/536, 537

(56) References Cited

U.S. PATENT DOCUMENTS

| | | | | |
|---|---|---|---|---|
| 5,781,784 A | * | 7/1998 | McKinley | 713/320 |
| 5,896,338 A | * | 4/1999 | Landgraf et al. | 365/226 |
| 6,058,048 A | | 5/2000 | Kwon | |
| 6,343,044 B1 | * | 1/2002 | Hsu et al. | 365/227 |
| 6,522,193 B2 | * | 2/2003 | Shin | 327/536 |

* cited by examiner

*Primary Examiner*—Gene N. Auduong
(74) *Attorney, Agent, or Firm*—Marger Johnson & McCollom, P.C.

(57) ABSTRACT

Ramping voltage circuits are described for augmenting or supplying a higher power-up slope upon initial power-up or a wake-up transition from a period of dormancy to a semiconductor memory device. Such ramping voltage circuits are responsive to a power-up signal, and are capable of increasing by at least two orders of magnitude the power-up slope, thereby enabling far quicker device turn-on. In one embodiment, a level shifter is used to ramp up the power-on voltage. In another embodiment, the internal voltage line is effectively shorted to an external voltage line via a power-up turned-on PMOS or depletion-type NMOS transistor.

24 Claims, 14 Drawing Sheets

550

650

320

INTERNAL VOLTAGE CONVERTER SCHEME FOR CONTROLLING THE POWER-UP SLOPE OF INTERNAL SUPPLY VOLTAGE

BACKGROUND OF THE INVENTION

1. Field of this Invention

This disclosure relates to a semiconductor memory device, and more particularly, to a semiconductor memory device having an internal supply voltage driver to provide internal supply voltage.

As the integration density of semiconductor memory devices increases and the high power up speed is required, the structure of internal supply voltage generating means of a memory cell array is very important especially in hand-held systems. Namely, when the internal supply voltage rises with the external supply voltage, the internal supply voltage reaches a level where the memory device can operate in a stabilized state after the external supply voltage reaches the appropriate level. This difference in rising time of the voltage level causes various problems.

For example, when a system accesses the semiconductor memory device, if the system accesses the memory device only according to the external supply voltage level, there is a possibility that the system uses the internal supply voltage that has not yet reached the minimum voltage level for operating the memory device. It means that the semiconductor memory device will incur errors.

2. Description of Prior Art

FIG. 1 is a block diagram of the conventional memory device. In this figure, the memory device will be considered as a flash memory device.

The memory device comprises an internal circuit 60, an Internal Voltage Converter (IVC) 500, a standby IVC driver 200, a power level detector 120, a CE buffer 140 and a CMD buffer 160. During the power-up period, the power level detector 120 generates a signal PDT with the external supply voltage. The signal PDT inputs to the internal circuits 60 and the CMD register 160 to reset the level in the memory device. The standby IVC driver 200 converts the external supply voltage to the internal supply voltage according to the level of reference voltage Vref. The standby IVC driver 200 always provides the internal voltage to the internal circuits after power up.

In FIG. 1, the IVC 500 comprises an active IVC controller and an active IVC driver. The active IVC controller (550 in FIG. 3) is activated only when CE buffer 140 and CMD register 160 generate an enable and busy signal, respectively. Those of skill in the art will appreciate that a standby IVC driver 200 is used in the standby mode for reducing the power consumption and the active IVC driver (550) is used during periods of active device operation to supply a sufficiently high voltage quickly to the memory device even when power consumption is high.

The circuit depicted in FIG. 2 is generally used in standby IVC driver 200. In FIG. 2, during power up, the standby IVC driver 200 receives a reference voltage Vref and an external supply voltage Vext to generate the internal voltage Vint. In the standby IVC driver, no signals are input to the driver 200 except the reference voltage Vref. Vref itself does not comprise other signals. Vref is controlled only by external voltage Vext. Because the standby IVC driver 200 always operates during the period of active device operation, driver 200 must generate an internal supply voltage Vint according to the level of reference voltage Vref. During that time, the power-up slopes of Vext and Vint are different from one another, as shown in FIG. 4. If the internal supply voltage is supplied to the memory device according to the external supply voltage, whereby Vext goes to the saturational level Vext at t1, the internal supply voltage remains lower than the minimum operating voltage Vdet over the time range A. As a consequence, an error may occur in the memory device.

Generally, the rise time of Vint for providing minimum operating voltage Vdet has taken approximately 6 μs. But recently, especially in hand-held systems, the IVC driver 200 is required to provide the internal supply voltage Vint to the memory device within 1 μs. As shown FIG. 3, because there is no power-up signal input to the active IVC controller 550, the internal voltage in accordance with the prior art is provided only by the standby IVC driver during the power-up period.

Accordingly, present invention provides an internal supply voltage far more quickly than the prior art.

DETAILED DESCRIPTION OF THE PREFERRED EMBODIMENT

Figure 5:
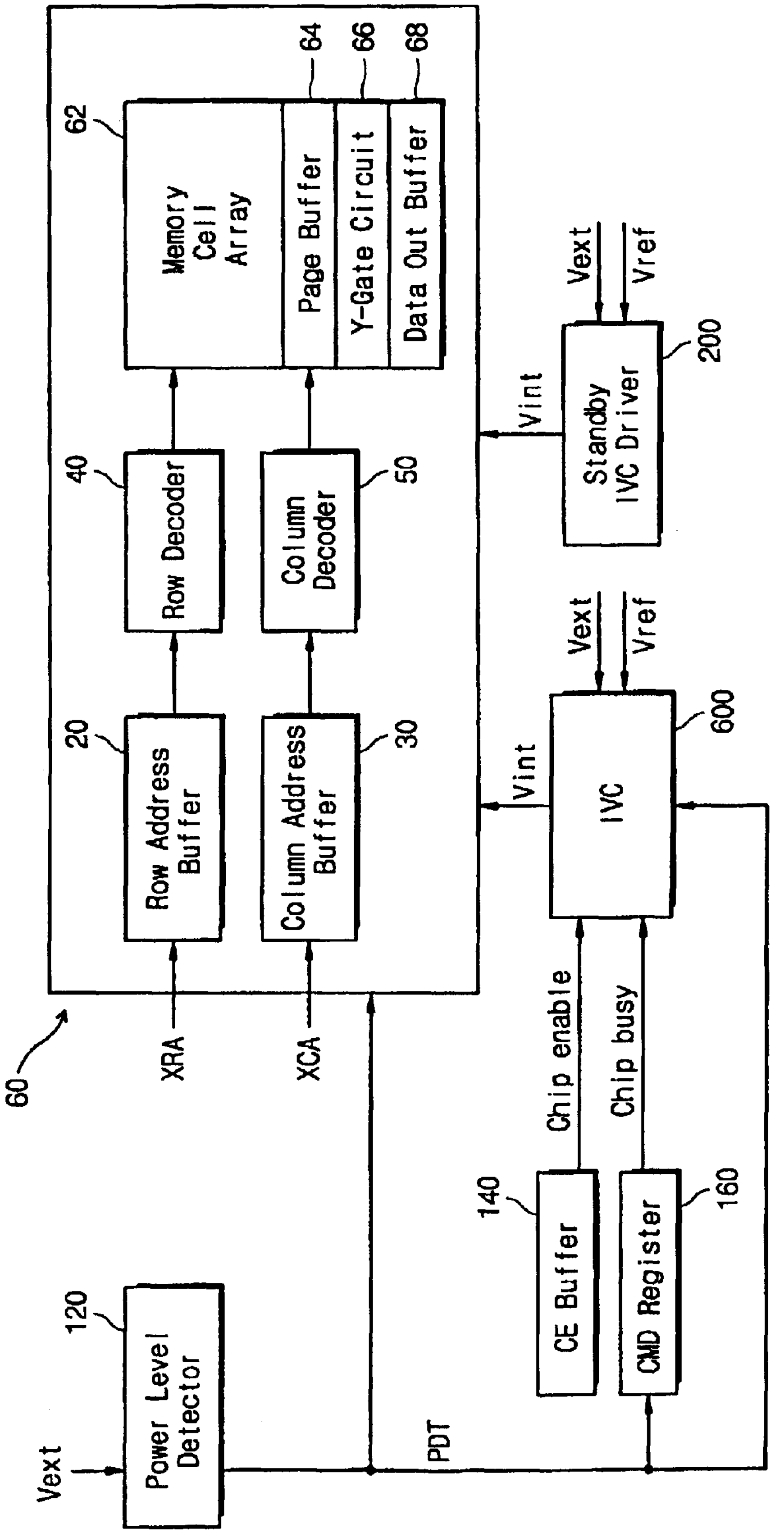
FIG. 5 is a block diagram of a memory device according to the present invention.

Referring to FIG. 5, the memory device comprises a power level detector 120, an Internal Voltage Converter (IVC) 600 and internal circuits 60. The internal circuits 60 will be understood to be the same as those of FIG. 1. Upon power up, a power level detector 120 generates a power-up signal PDT. The signal PDT activates the IVC 600 to produce internal supply voltage Vint. The IVC 600 provides the required internal supply voltage Vint to internal circuits 60.

Power-up is used broadly herein to refer to any intended ramping up of power from a nominal zero volts to a nominal supply voltage, whether such occurs at initial power-up or start-up, for example, of a hand-held, flash memory-based device such as a digital camera or after initial start-up but after a dormant (or so-called sleep) period wherein the power supplied to the device's internal circuits has been either diminished (e.g. to a standby level) or removed.

Figure 6:
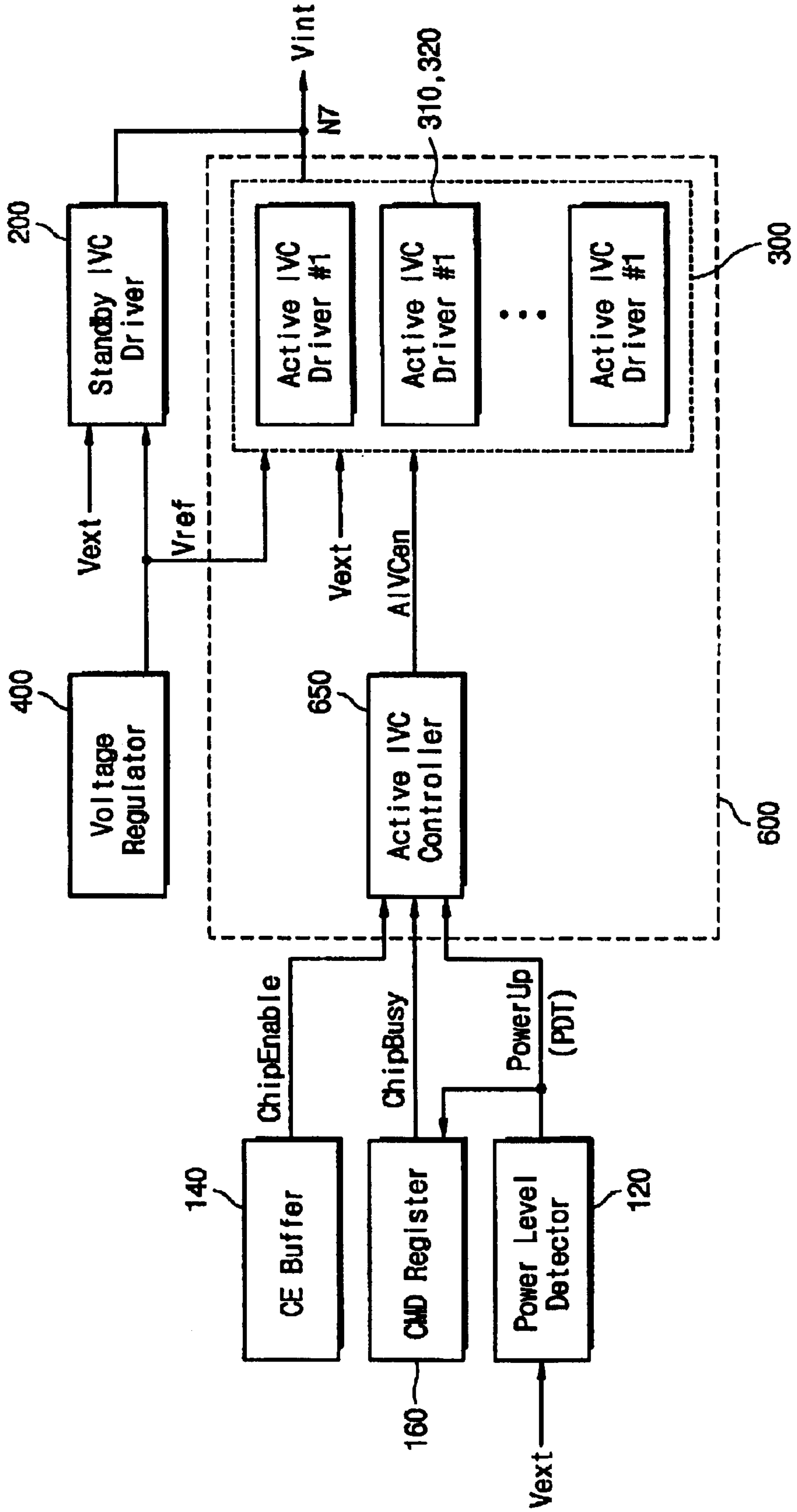
FIG. 6 illustrates a first embodiment of the present invention.

FIG. 6 is a block diagram illustrating a first embodiment of this invention. FIG. 6 comprises a power level detector 120, a CE Buffer 140, a CMD register 160, a Voltage Regulator 400 and an IVC 600. In accordance with the prior art, the active IVC controller 650 is activated only when the CE Buffer 140 or the CMD register 160 is enabled. The CE Buffer 140 provides chip enable information and the CMD Register 160 provides read, program, and erase information. The power-up signal PDT of the power level detector 120 does not input to the IVC controller 650 but inputs instead to the CMD register 160 and internal circuits 60 only for resetting the memory device. In contrast to the prior art teachings by which no power up signal PDT inputs to the IVC controller 650, in accordance with the present invention, the signal PDT inputs to the IVC controller 650 during the power up period.

In other words, novel IVC controller 650 is activated whenever one of the three signals, the chip enable signal from CE buffer 140, the chip busy signal from CMD register 160 or the power up signal from power level detector 120, is active.

Figure 7:
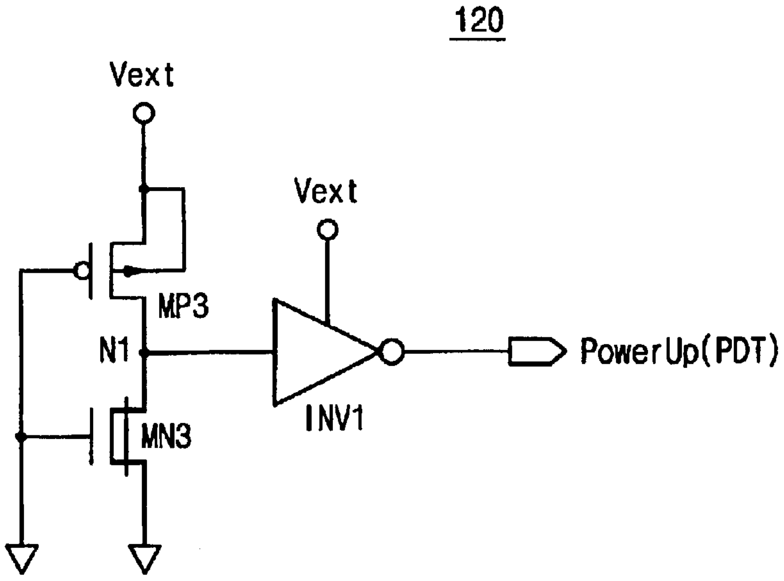
FIG. 7 illustrates a power level detector.

The power level detector 120 of the present invention is shown in FIG. 7. There are many types of power level detectors. Although other power level detectors are contemplated as being within the spirit and scope of the invention, the featured power level detector 120 has a p-mos and an n-mos depletion transistor that are serially connected to each other, in accordance with the present invention. The gates of the two transistors are connected in common to ground. The source of the p-mos transistor MP3 is connected to the external voltage Vext, and the drain thereof is connected to node N1 and to the drain of the n-mos transistor MN3. An n-type well which is used for the bulk of the p-mos transistor MP3 is connected to the external supply voltage Vext having high potential. The source of the n-mos transistor MN3 is connected to ground. The n-mos transistor MN3 connected between the node N1 and ground is a depletion type and has a long channel, thus providing high resistance.

Figure 8:
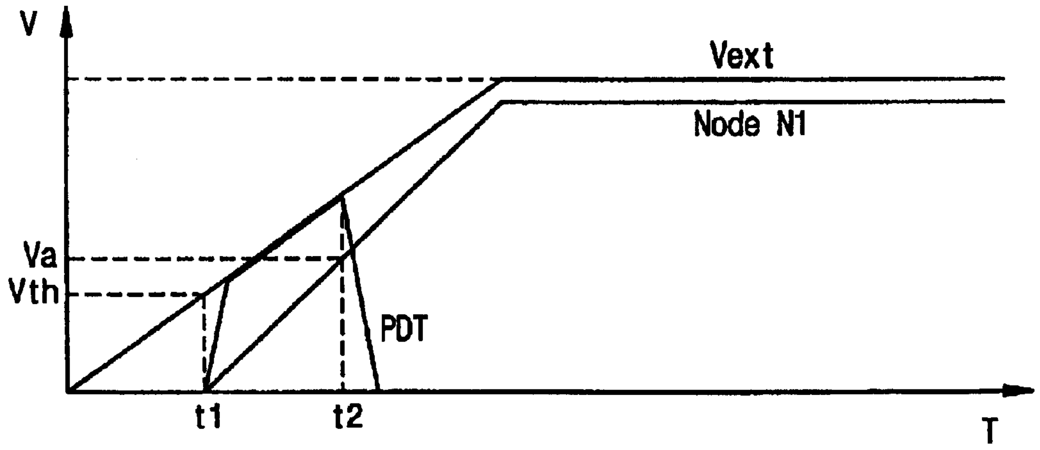
FIG. 8 is a timing diagram of FIG. 7.

As shown in FIGS. 7 and 8, the level of node N1 is ground level because of an n-mos depletion transistor MN3. When the external supply voltage Vext reaches to the threshold voltage Vth of p-mos transistor MP3, the p-mos transistor MP3 turns on at t1. After time t1, the node N1 ramps up from ground to the external supply voltage but does not reach the voltage Vext because of the n-mos depletion transistor MN3. At the same time, the power up signal PDT ramps up from ground to the voltage Vext and reaches the voltage Vext in a short time because n-mos transistor (not shown) of inverter INV1 is turned off. When the gate-to-source voltage Vgs of n-mos and p-mos transistor (not shown) in the inverter INV1 are the same, the power up signal PDT goes down toward ground level. In other words, when the node N1 level reaches a certain trip-point level Va at t2, the PDT goes logical LOW level. In general, the PDT is logical HIGH level before t2 and logical LOW level after t2. As a result, the power up period is finished after time t2.

During the power-up period, the power-up signal PDT goes HIGH and inputs to the IVC controller. The IVC (600 in FIG. 6)—which comprises an active IVC Controller (650), active IVC drivers (300) and standby IVC driver (200)—receives the power-up signal PDT from power level detector (120).

Figure 9:
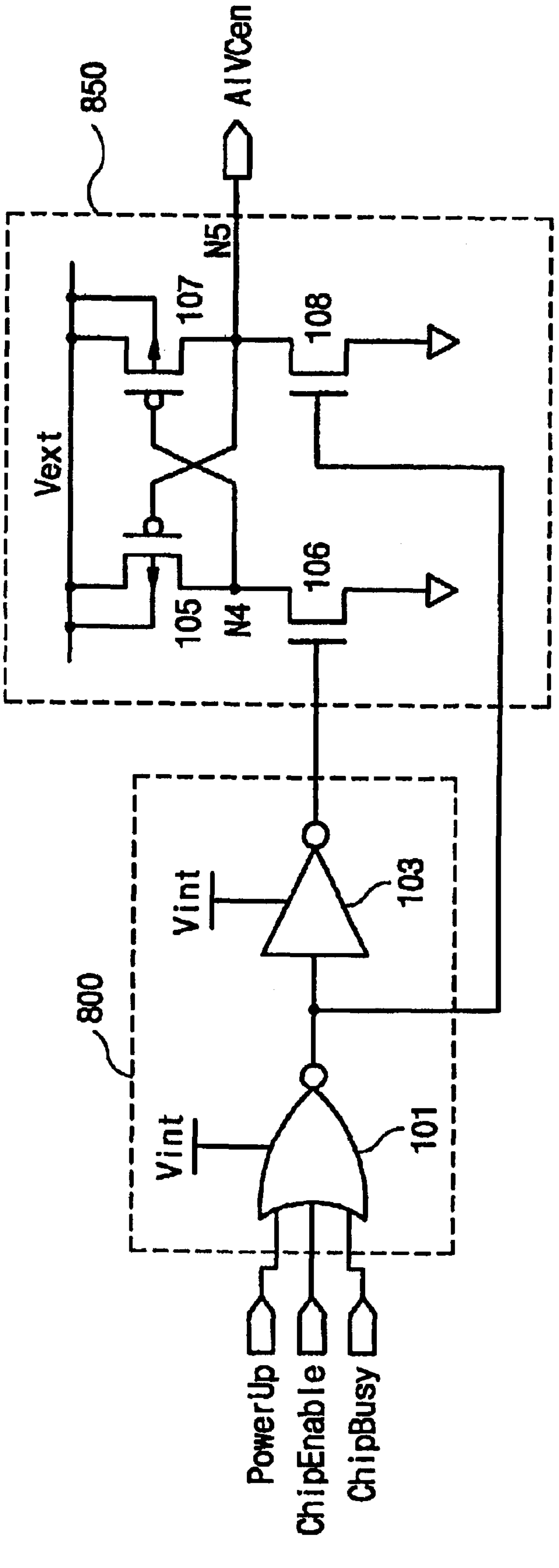
FIG. 9 illustrates an active IVC driver controller.

As shown in FIGS. 5 and 9, the active IVC Controller 650 (see FIG. 9) receives the power-up signal PDT which is a logic HIGH. The active IVC controller 650 generates an active IVC enable signal AIVCen. The active IVC Controller 650 comprises control logic 800 (coupled to the internal supply voltage Vint) and a level shifter 850. The control logic 800 includes a NOR gate 101 and an inverter 103. The NOR gate 101 receives a power-up signal PDT, a chip enable signal ChipEnable and chip busy signal ChipBusy. According to this invention, because the power level detector (120 in FIG. 5) generates a power-up signal PDT at a logic HIGH, the output of the NOR gate 101 goes to a logic LOW. The level of the gate of the n-mos transistor 106 is a logic HIGH, which turns on the transistor 106 when the output of the inverter 103 goes HIGH. So the node N4 goes LOW and turns on the p-mos transistor 107. As a result, the external supply voltage Vext is provide to the node N5. Specifically, the output of the control logic 800 is shifted to the other level Vext, the same as the level of the active IVC enable signal AIVCen through the level shifter 850.

There are many types of level shifters 850. In this invention, the level shifter uses an external voltage Vext as a voltage source. Namely, the active IVC enable signal AIVCen is raised to the level of Vext. Those of skill in the art will appreciate that, within the spirit and scope of the invention, other types may be used.

Figure 10:
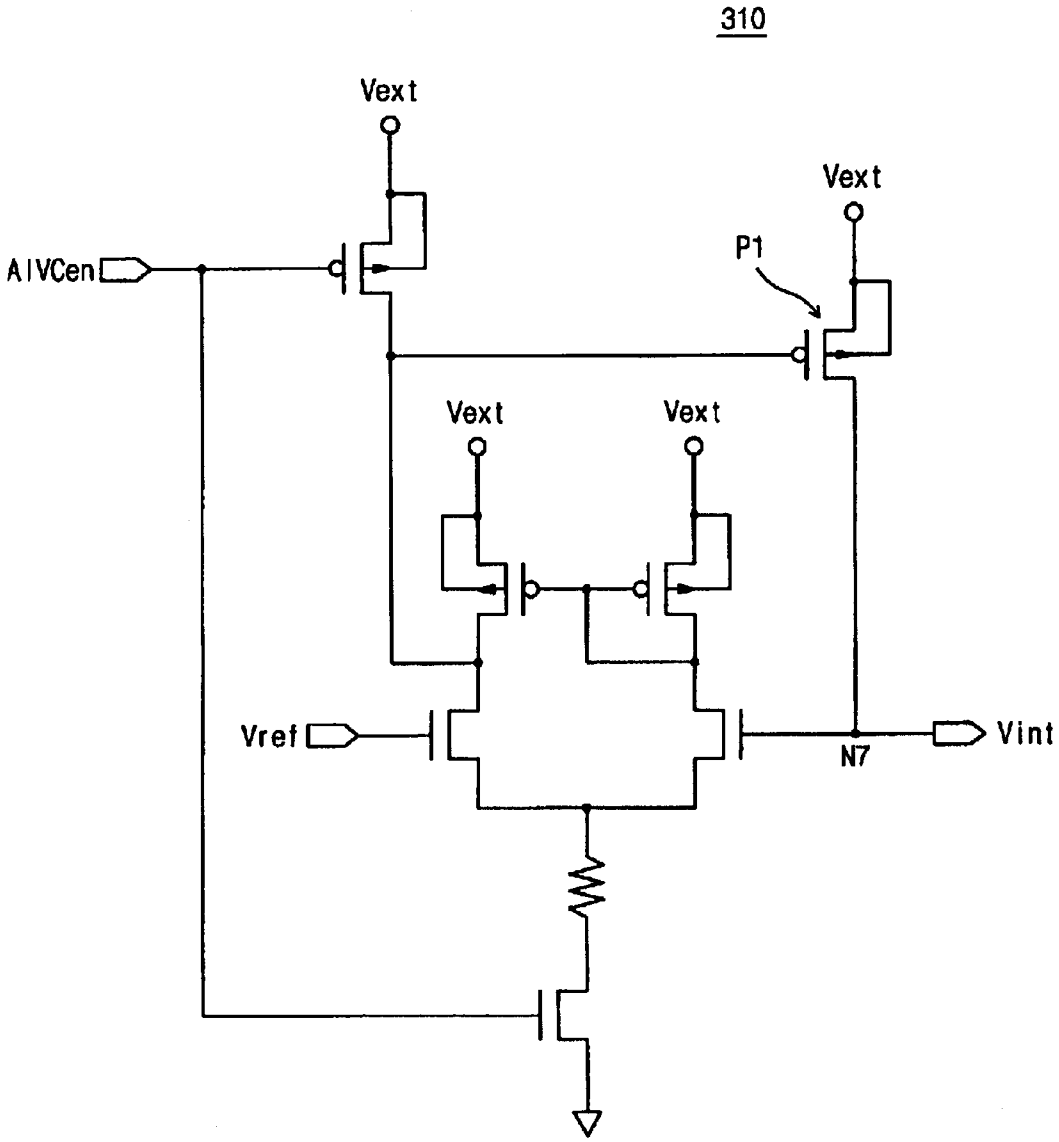
FIG. 10 illustrates an active IVC driver.

When the active IVC enable signal AIVCen (which is the output of the active IVC controller 650) inputs to the active IVC Drivers (300 in FIG. 6), the drivers (300) generate an internal voltage Vint at node N7. A representative one of the active IVC drivers is shown in FIG. 10. There are many types of active IVC drivers. In this invention, two such driver types will be described. Those of skill in the art will appreciate that, within the spirit and scope of the invention, other types may be used.

Figure 11:
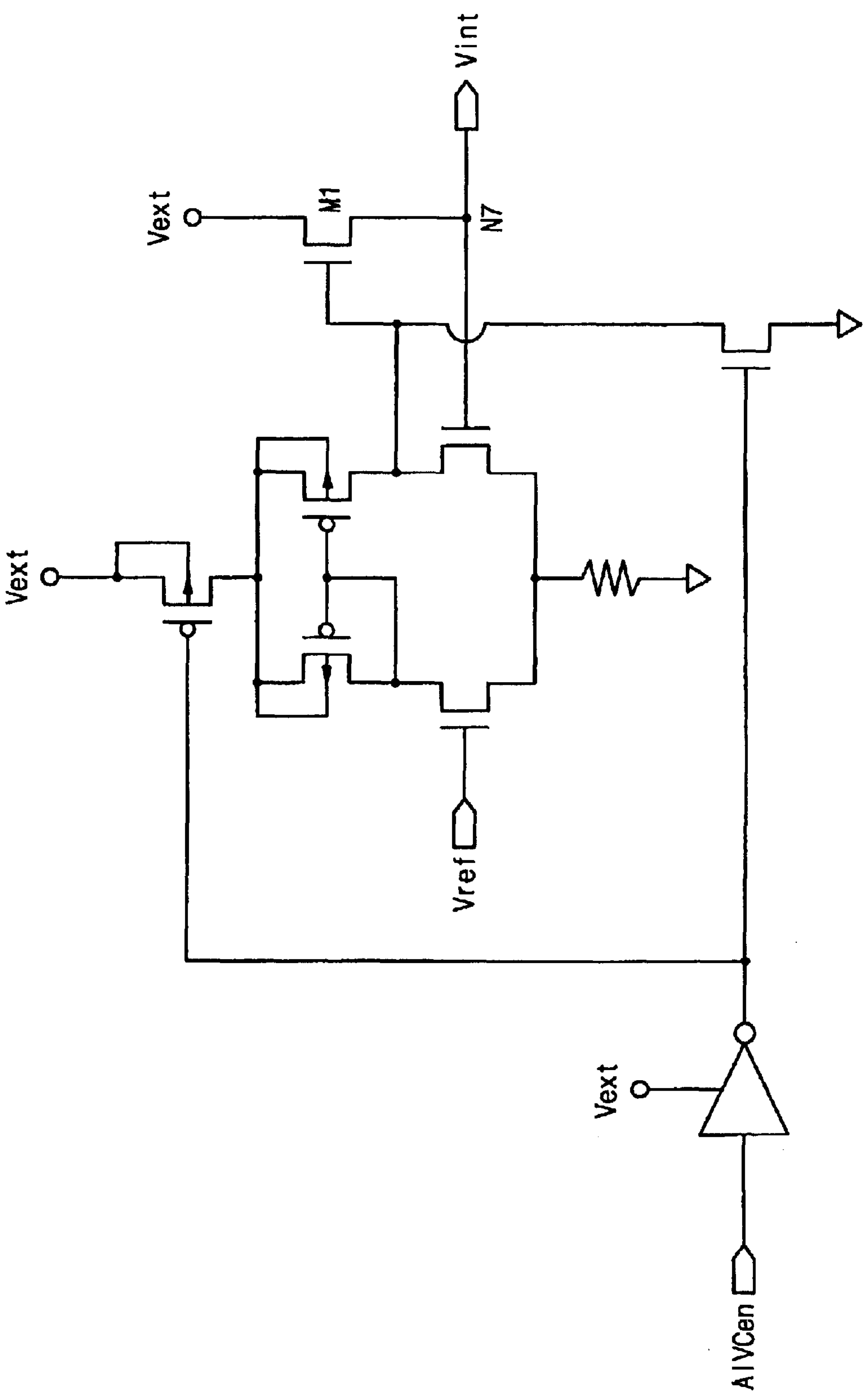
FIG. 11 illustrates another active IVC drivers.

One of the active IVC drivers is shown in FIG. 10 and the other is shown in FIG. 11. The active IVC driver 310 of FIG. 10 operates as follows. The external supply voltage Vext is supplied to the node N7 as an internal supply voltage Vint through the p-mos transistor P1. Similarly, the external supply voltage Vext is supplied to node N7 in active IVC driver 320 of FIG. 11 as an internal supply voltage Vint through the n-mos transistor M1. Each of the two active IVC drivers (310 of FIG. 10, 320 of FIG. 11) receives and is controlled by the active IVC enable signal AIVCen. In both cases, the driver (310, 320) receives a reference voltage signal Vref as well as the active IVC enable signal AIVCen.

Figure 12:
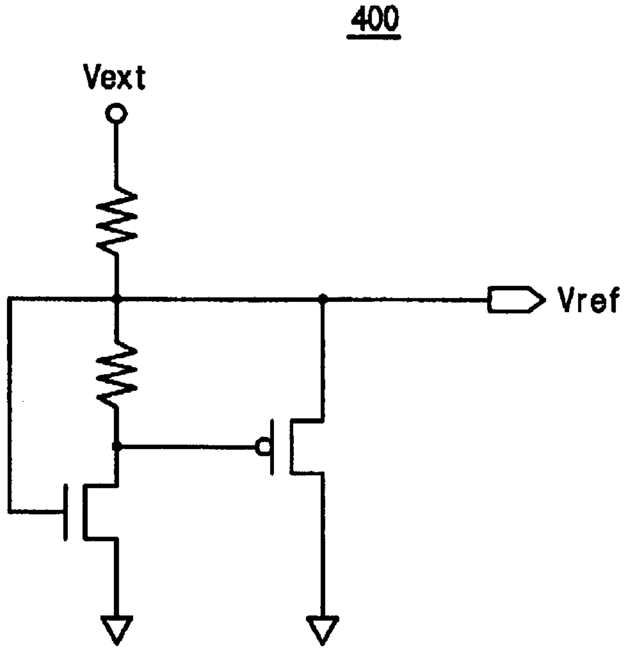
FIG. 12 illustrates a voltage regulator.

The reference voltage signal is generated by a Voltage Regulator 400, as illustrated in FIG. 12. Because any one of many known Voltage Regulators 400 can be used in this invention, it will not be further explained.

Figure 13:
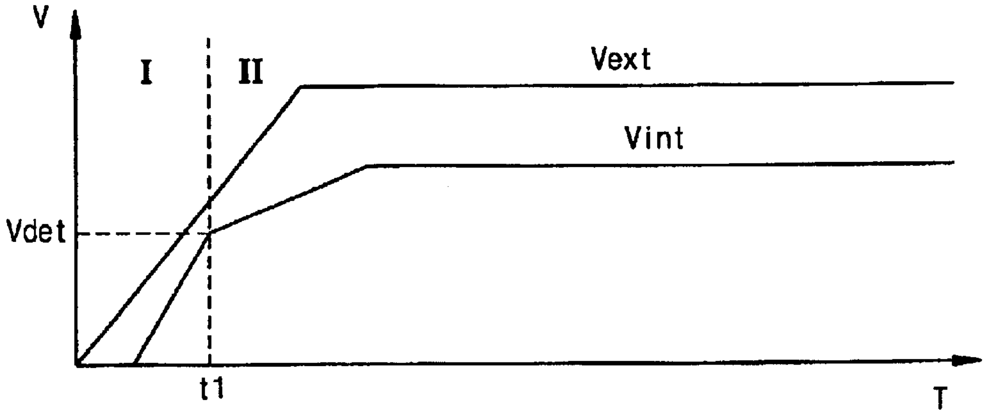
FIG. 13 is a timing diagram corresponding to FIG. 6.

Referring next to FIG. 13, it will be appreciated that the active IVC driver (310 of FIG. 10, 320 of FIG. 11) has a high charge driving capability compared with the standby IVC driver (200 in FIG. 6). Accordingly, when the internal supply voltage Vint passes the external supply voltage Vext by way of the active IVC driver, the slope of the internal supply voltage Vint is greater than that of the standby IVC driver (200). Moreover, The slope of the internal supply voltage Vint is nearly as great as that of the external supply voltage Vext.

It is possible to use several active IVC drivers (300 in FIG. 6) to provide the internal supply voltage to the node N7. Preferably, plural active IVC drivers (300) are used to provide the internal supply voltage Vint. This increases the internal supply voltage ramping-up speed (slope) and minimizes the speed difference between the external supply voltage Vext and the internal supply voltage Vint. Thus, the internal supply voltage Vint can be provided to the internal circuits within the required shorter time in the newer and more demanding hand-held systems.

Indeed, the invention makes it possible to achieve power-up voltage ramp slopes up to at least two orders of magnitude higher than has been conventionally possible, rendering memory device turn-on times far less than the required 1 μs maximum. This permits use of the invention in the most demanding digital camera applications, which may require as low as 1 microsecond power-up timing, rather than the several microsecond to millisecond ramp-up timing that conventional standby power techniques provided.

In FIGS. 6, 7 and 13, during the power-up operation, the power level detector (120 in FIGS. 6 and 7) generates the power-up signal PDT of a logic HIGH.

According to the level of the power level detector, the IVC generates the internal supply voltage. The internal supply voltage Vint ramps up quickly, closely following the ramp of the external supply voltage Vext, until the internal supply voltage reaches the minimum operating voltage Vdet, as shown in FIG. 13.

As a result, the internal supply voltage rapidly goes to the Vdet level. After the power level detector (120 of FIG. 7) generates a logic LOW and the level of the node N1 of FIG. 7 exceeds the Va level, the IVC driver (310 of FIG. 10, 320 of FIG. 11) stops providing the internal supply voltage Vint to the node N7. Thereafter, the internal supply voltage connected to the node N7 is supplied only the external supply voltage Vext from the standby IVC driver. As shown in FIG. 13, after passing the time t1 when the level of Vdet is reached, the slope of supplied voltage is equal to the slope of the internal supply voltage Vint from the standby IVC driver (200 of FIG. 6). Even though the slope of the internal supply voltage Vint after time t1 follows that of the standby IVC driver, because the internal supply voltage Vint already has achieved the minimum operating voltage Vdet within the required time, the system operates properly and without errors.

Figure 1:
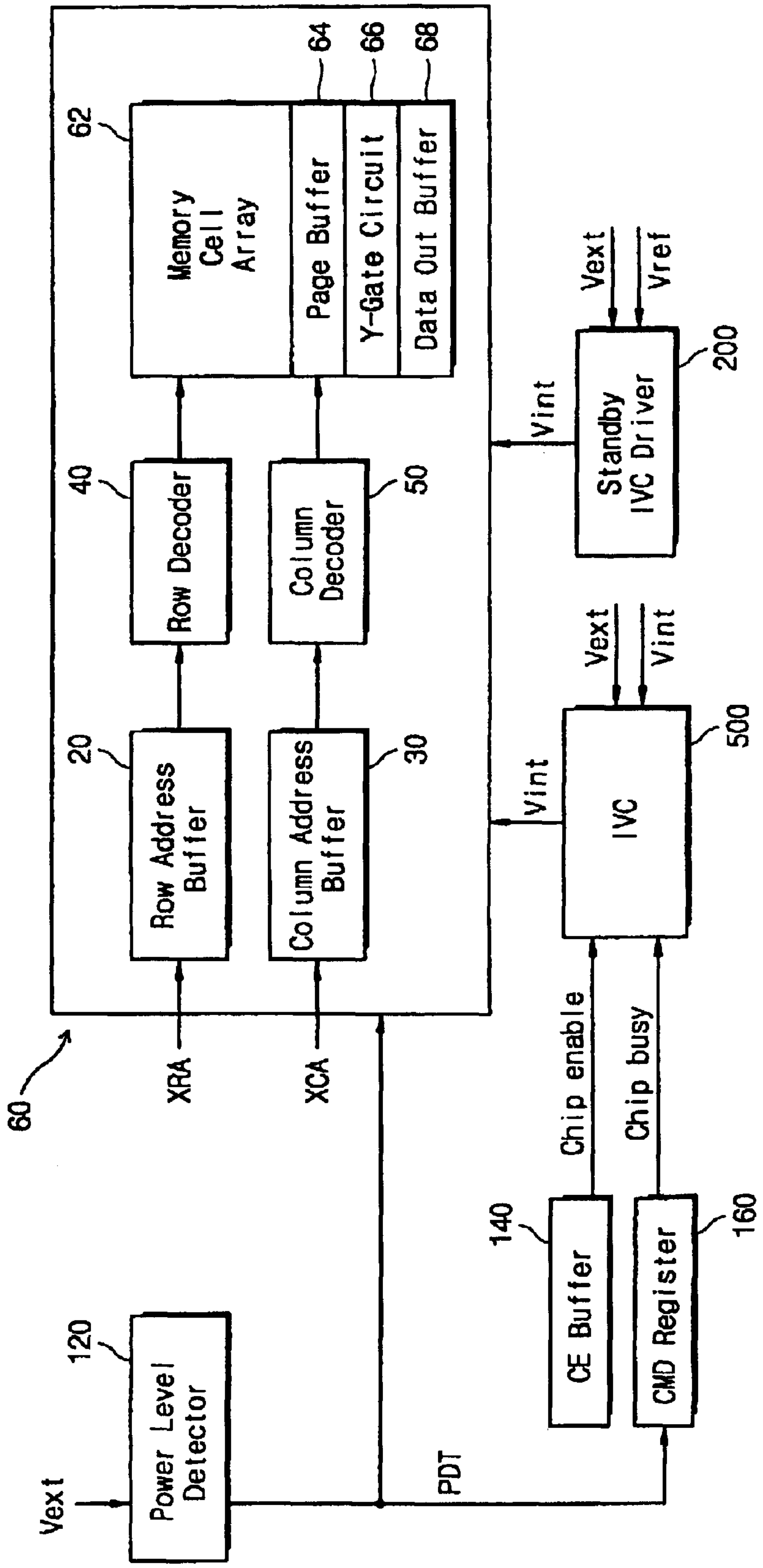
Fig 1 (Prior Art)
FIG. 1 is a block diagram of a conventional memory device.
Figure 2:
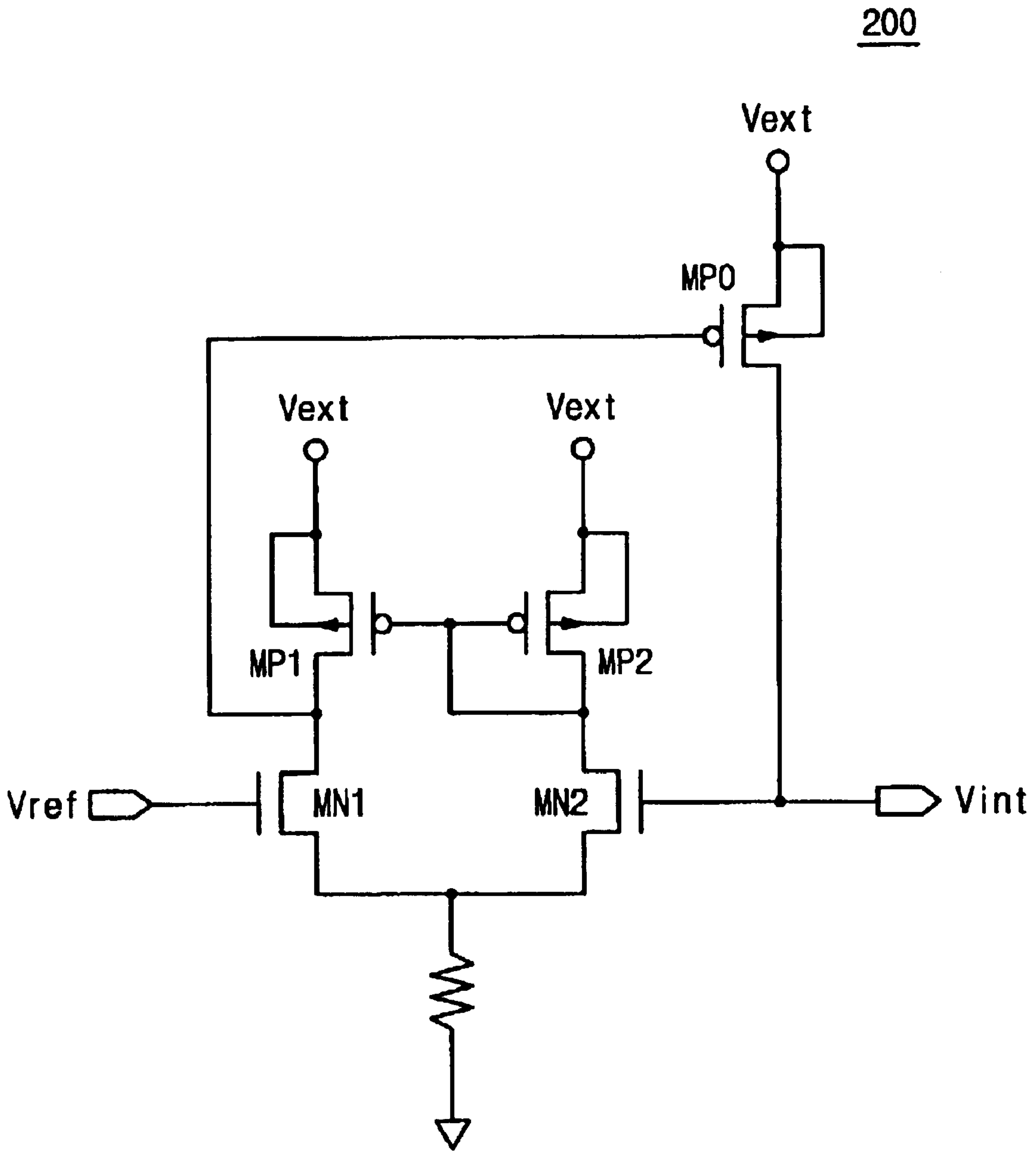
Fig 2 (Prior Art)
FIG. 2 illustrates a conventional standby IVC driver.
Figure 3:
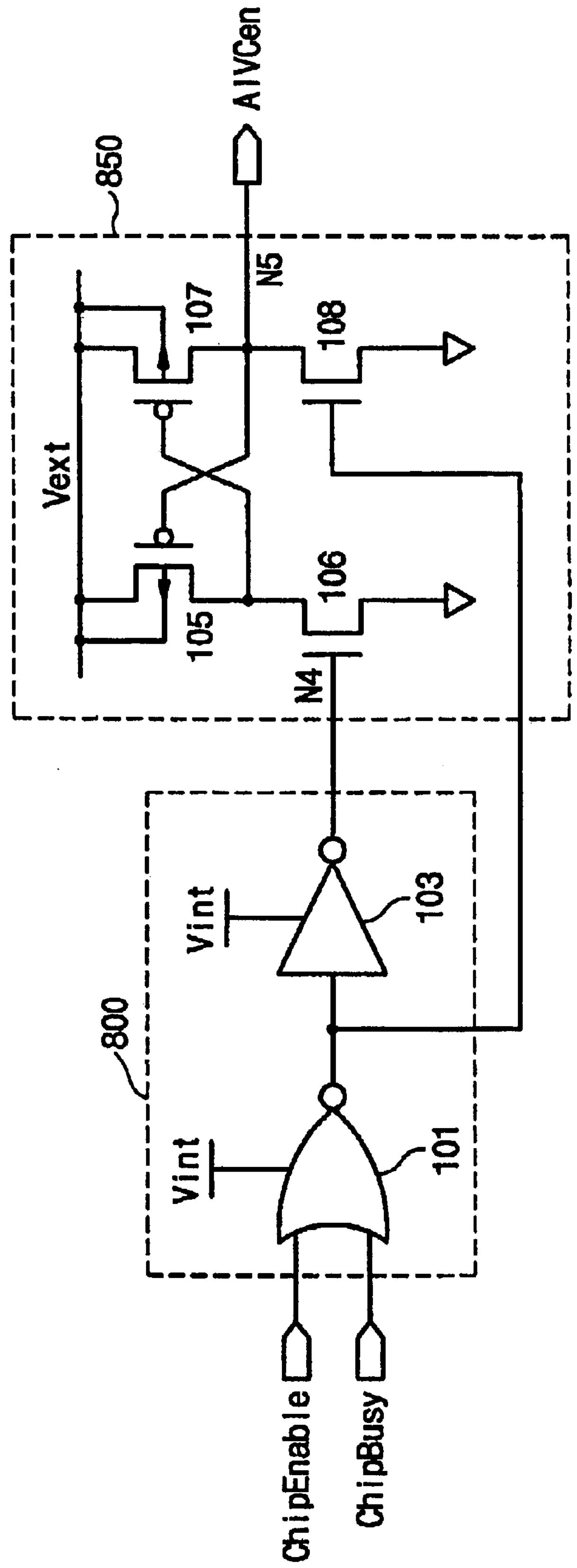
Fig 3 (Prior Art)
FIG. 3 illustrates a conventional active IVC controller for producing an active IVC enable signal.
Figure 4:
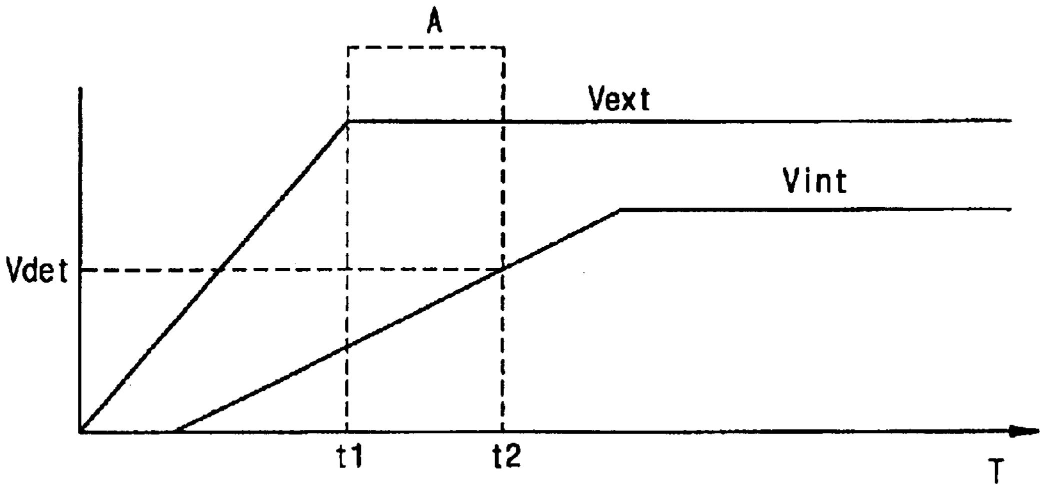
Fig 4 (Prior Art)
FIG. 4 is a timing diagram corresponding to FIG. 2.

In contrast, the active IVC driver of the prior art operates only when the memory device receives the chip enable signal or chip busy signal (see FIG. 1). Moreover, the standby IVC Driver (200 of FIG. 1) provides only an internal voltage to the internal circuits during the power-up period. So, it is impossible to provide the internal supply voltage to the internal circuits within 1 μs, which is the required time in recent systems.

Figure 14:
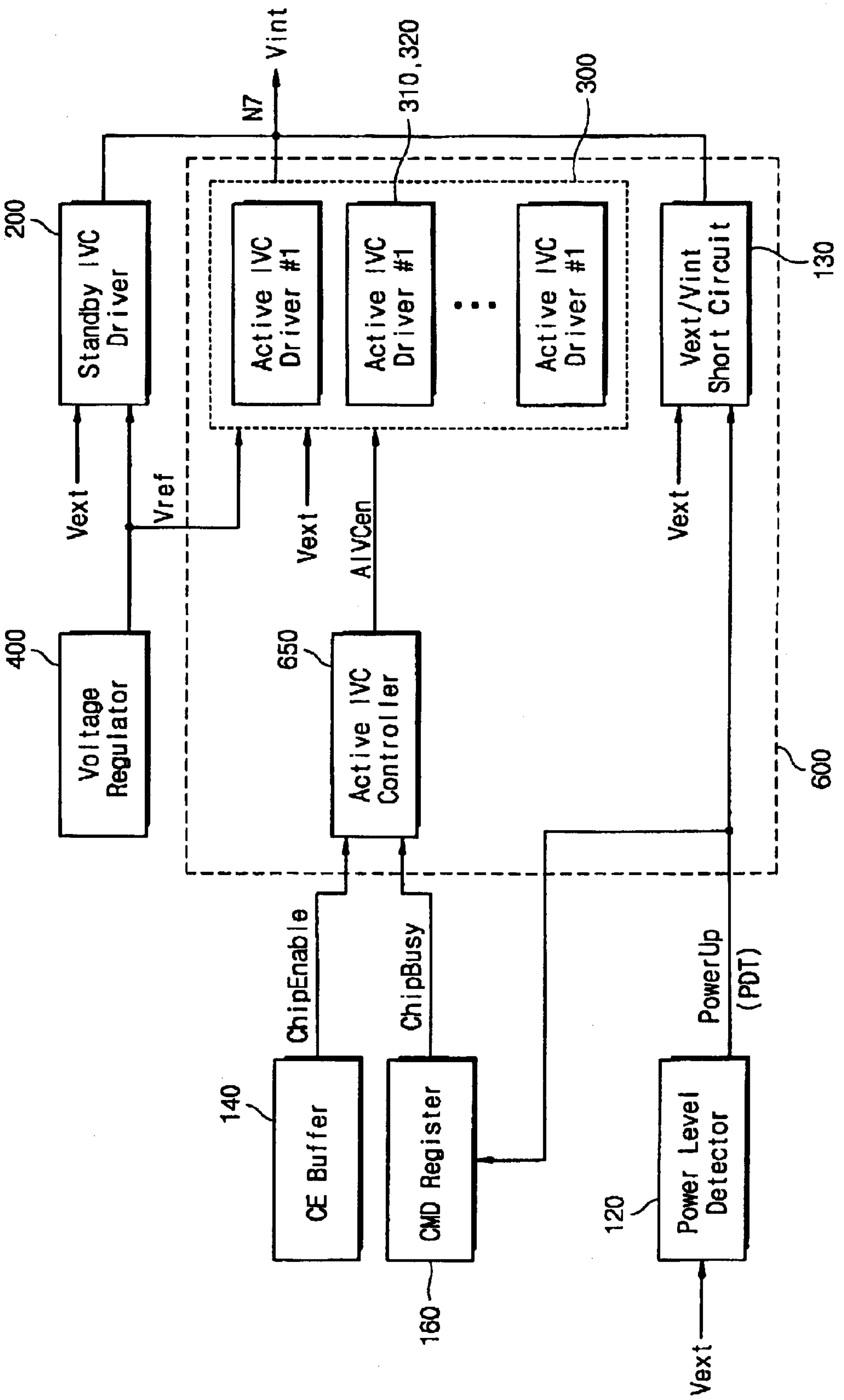
FIG. 14 illustrates a second embodiment of present invention.

FIG. 14 illustrates a second embodiment of the present invention.

Figure 16:
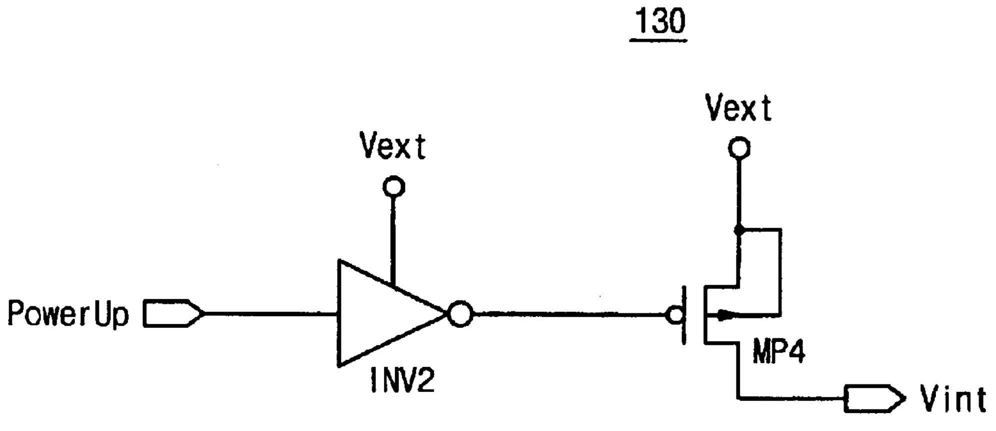
FIG. 16 illustrates a Vint and Vext short circuit.

In this embodiment, the IVC 600 further comprises a Vint/Vext short circuit 130. The power-up signal PDT of the power level detector 120 does not input to the active IVC controller 650 but it does input to the Vint/Vext short circuit 130. The active IVC controller is activated by the CE Buffer 140 and CMD Register 160, as in the prior art. But, in important contrast, the internal supply voltage Vint is supplied to the node N7 by way of the Vint/Vext short circuit controlled by the power-up signal PDT. The Vint/Vext short circuit is shown in FIG. 16. As may be seen from FIG. 16, the power-up signal PowerUp (PDT) inputs to an inverter INV2 to turn on p-mos transistor MP4, effectively shorting Vext to Vint. (During the power-up period, the power-up signal PowerUp (PDT) goes to a logic HIGH. The gate of the p-mos transistor goes to logic LOW via an inverter INV2. The p-mos transistor MP4 turns on and the external supply voltage Vext is connected to the internal supply voltage Vint via the on transistor, effectively shorting Vext to Vint.). Within the spirit and scope of the invention, the p-mos transistor MP4 may change to an n-mos transistor (depletion or enhancement type.)

Figure 17:
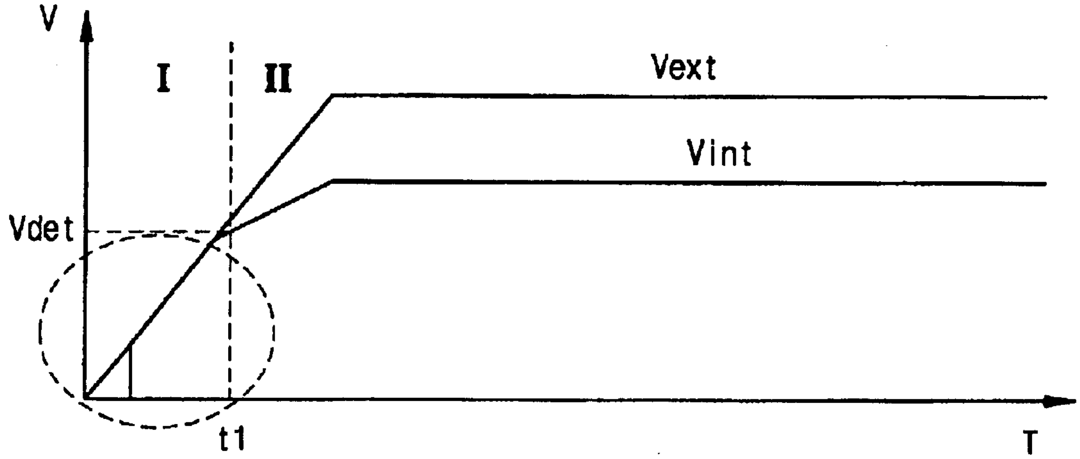
FIG. 17 is a timing diagram corresponding to FIGS. 14 and 15.

The beneficial result of electrically shorting the two voltages Vext and Vint is illustrated in FIG. 17. During the power up, the internal supply voltage Vint ramps up and precisely tracks the external supply voltage Vext until time t1. At that time, the internal supply voltage reaches the minimum operating voltage Vdet. After the power-up signal PDT goes to a logic LOW, as described above in connection with the first embodiment of invention, the slope of the internal supply voltage Vint tracks that of the standby IVC driver (200 of FIG. 14).

As a result, it is possible to provide a quickly ramped-up internal supply voltage Vint within the system required time.

Figure 15:
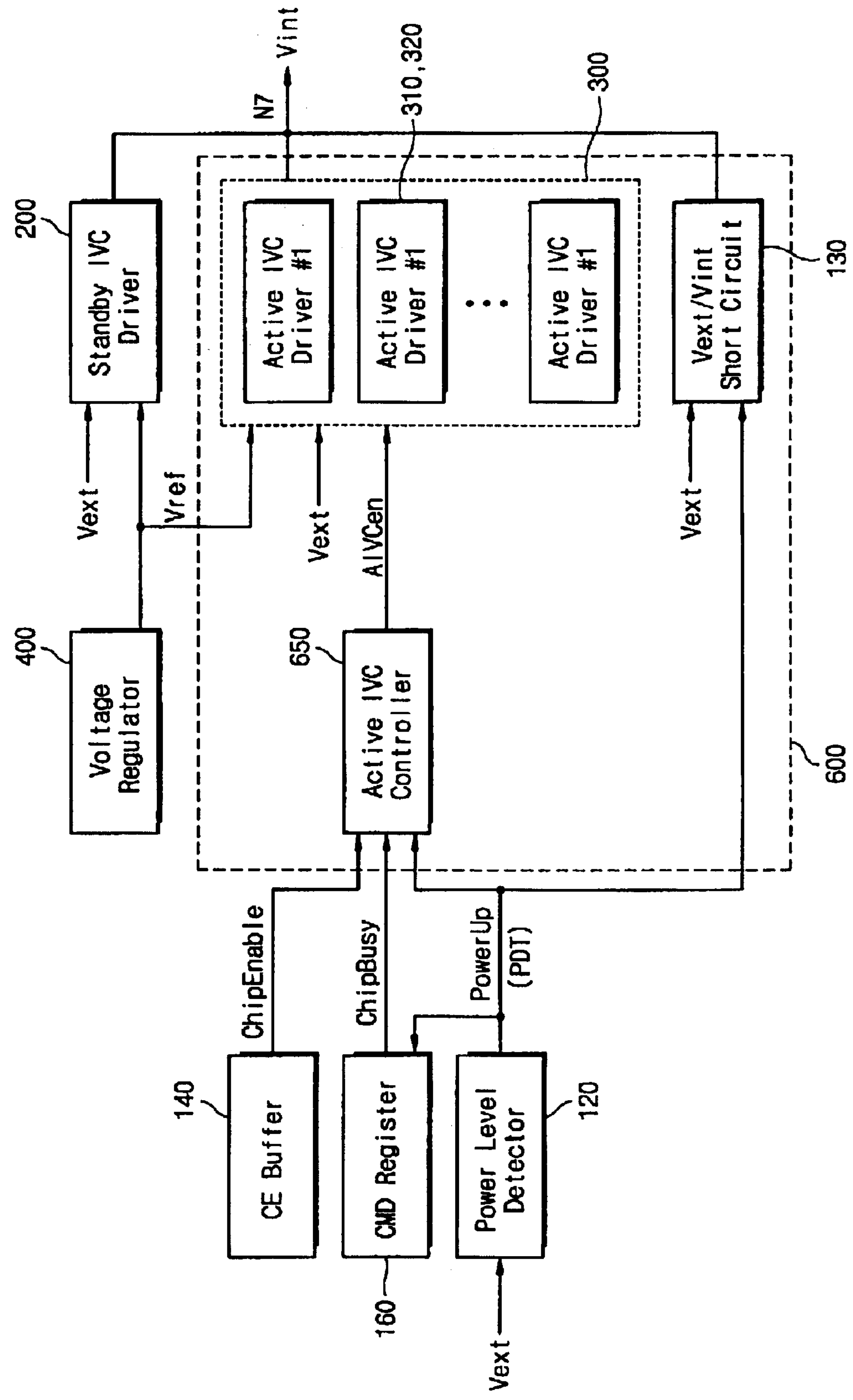
FIG. 15 is the third embodiment of present invention.

FIG. 15 is a third embodiment of the present invention. In this figure, the power-up signal PDT of the power-up detector 120 inputs to the active WVC controller and Vext/Vint short circuit 130. According as the power-up signal PDT concurrently inputs to the active IVC controller and Vext/Vint short circuit 130, the internal supply voltage Vint generated from the external supply voltage Vext ramps up more rapidly. In this hybrid embodiment, active IVC controller 650 has three inputs, PowerUp, ChipEnable and ChipBusy, as shown in FIG. 9 and as described above.

A person skilled in the art will be able to practice the present invention in view of the description present in this document, which is to be taken as a whole. Numerous details have been set forth in order to provide a more thorough understanding of the invention. In other instances, well-known features have not been described in detail in order not to obscure unnecessarily the invention.

While the invention has been disclosed in its preferred embodiments, the specific embodiments as disclosed and illustrated herein are not to be considered in a limiting sense. Indeed, it should be readily apparent to those skilled in the art in view of the present description that the invention may be modified in numerous ways. The inventor regards the subject matter of the invention to include all combinations and sub-combinations of the various elements, features, functions and/or properties disclosed herein.

The following claims define certain combinations and sub-combinations, which are regarded as novel and non-obvious. Additional claims for other combinations and sub-combinations of features, functions, elements and/or properties may be presented in this or a related document.

I claim:

1. A circuit for generating an internal operating voltage for use in a memory device, the circuit comprising:

a power level detector receiving an external voltage for generating a power up signal; and a ramping voltage generator coupled to the power level detector and structured to ramp the internal operating voltage to a minimum operating voltage when the ramping voltage generator receives the power up signal.

2. The circuit of claim 1 which further comprises:

a standby voltage generator structured to maintain the internal operating voltage at least at the minimum operating voltage after the internal operating voltage has been ramped by the ramping voltage generator.

3. The circuit of claim 2, wherein the ramping voltage generator turns off after the minimum operating voltage is reached.

4. The circuit of claim 1, wherein the ramping voltage generator produces no output voltage before the power up signal is generated.

5. The circuit of claim 1, wherein the power-up signal is a wake-up signal representing an end to a period of dormant memory device operation.

6. A circuit for generating an internal operating voltage for use in a memory device, comprising:

a voltage controller having an input for receiving a power-up signal, and for generating a control signal when the power-up signal is received; and one or more voltage drivers each having separate inputs and a common output, each voltage driver structured to raise the internal operating voltage on the common output when the control signal is received at its respective input.

7. The circuit of claim 6, wherein the voltage controller comprises:

a set of control logic having a plurality of inputs; and a voltage level shifter coupled to an output of the control logic.

8. The circuit of claim 7, wherein one of the plurality of inputs is the power-up signal.

9. The circuit of claim 7, wherein the voltage level shifter is structured to accept an output from the control logic and generate the control signal.

10. The circuit of claim 7, wherein at least one of the voltage drivers comprises:

a first circuit portion coupled to an external voltage line;

a voltage raising circuit portion coupled to the first circuit portion and coupled to the common output, the voltage raising circuit structured to raise the voltage of the common output when the control signal is received.

11. The circuit of claim 7 which further comprises:

a standby voltage generator structured to maintain the internal operating voltage at least at the minimum operating voltage after the internal operating voltage has been raised to the minimum operating voltage by the one or more voltage drivers.

12. The circuit of claim 11, wherein at least one of the one or more voltage drivers turns off after the minimum operating voltage is reached.

13. The circuit of claim 12, wherein all of the one or more voltage drivers turns off after the minimum operating voltage is reached.

14. The circuit of claim 11, wherein the one or more voltage drivers have more voltage raising capacity than the standby voltage generator.

15. A voltage ramping circuit for generating an internal operating voltage for use in a memory device, the voltage ramping circuit comprising:

a power level detector receiving an external voltage for generating a power up signal; and a shorting circuit coupled to an external voltage line and structured to short the external voltage line to an internal voltage line when the shorting circuit receives the power up signal.

16. The ramping circuit of claim 15, wherein the shorting circuit comprises a PMOS transistor having a source coupled to the external voltage line, a control gate for receiving the power up signal, and having a drain coupled to the internal voltage line.

17. The ramping circuit of claim 15, wherein the shorting circuit comprises a depletion-type NMOS transistor having a source coupled to the external voltage line, a control gate for receiving the power up signal and a drain coupled to the internal voltage line.

18. An internal voltage ramping circuit for use in a memory device, comprising:

a voltage controller having an input for receiving a power-up signal and structured to generate a control signal when the power-up signal is received;

one or more controller drivers each having an input and a common output, and each controller driver structured to raise an internal voltage on the common output when the control signal is received; and a shorting circuit coupled to an external voltage and structured to couple the common output to the external voltage when the shorting circuit receives the power up signal.

19. The ramping circuit of claim 18, wherein the shorting circuit comprises a PMOS transistor having a source coupled to the external voltage, a control gate for receiving an output of the power up signal, and having a drain coupled to the common output.

20. The ramping circuit of claim 18, wherein the shorting circuit comprises a depletion-type NMOS transistor having a source coupled to the external voltage, a control gate for receiving the control signal and a drain coupled to the common output.

21. A method for generating an internal operating voltage for use in a memory device, comprising:

detecting a power-up signal;

generating an enable signal when the power-up signal is detected;

providing the enable signal to one or more voltage ramping circuits; and ramping the internal operating voltage from zero volts to the minimum operating voltage when the enable signal is provided to the one or more voltage ramping circuits.

22. The method of claim 21 which further comprises:

disabling the one or more voltage ramping circuits when the internal operating voltage has reached the minimum operating level.

23. The method of claim 22 which further comprises:

maintaining the internal operating level at least the minimum operating level after the one or more voltage ramping circuits is turned off.

24. The method of claim 22 which further comprises:

at least until the internal operating voltage has reached the minimum operating level, providing also a standby voltage generator operative concurrent with the operation of the one or more voltage ramping circuits, thereby to increase the rise time of the voltage ramp.

* * * * *

UNITED STATES PATENT AND TRADEMARK OFFICE

CERTIFICATE OF CORRECTION

PATENT NO. : 6,795,366 B2 Page 1 of 1
DATED : September 21, 2004
INVENTOR(S) : Lee It is certified that error appears in the above-identified patent and that said Letters Patent is hereby corrected as shown below:

Column 6,
Line 15, "active WVC controller" should read -- active IVC controller --.

Signed and Sealed this

Twelfth Day of July, 2005

JON W. DUDAS
*Director of the United States Patent and Trademark Office*